(12) United States Patent
Weisfield et al.

(10) Patent No.: US 7,902,004 B2
(45) Date of Patent: Mar. 8, 2011

(54) ESD INDUCED ARTIFACT REDUCTION DESIGN FOR A THIN FILM TRANSISTOR IMAGE SENSOR ARRAY

(75) Inventors: Richard Weisfield, Los Altos, CA (US); Kungang Zhou, San Jose, CA (US); David Doan, San Jose, CA (US)

(73) Assignee: dpiX LLC, Palo Alto, CA (US)

( * ) Notice: Subject to any disclaimer, the term of this patent is extended or adjusted under 35 U.S.C. 154(b) by 40 days.

(21) Appl. No.: 12/250,780

(22) Filed: Oct. 14, 2008

(65) Prior Publication Data

US 2010/0091149 A1    Apr. 15, 2010

(51) Int. Cl.
*H01L 21/00* (2006.01)
*H01L 21/84* (2006.01)

(52) U.S. Cl. .......... 438/151; 438/142; 438/149; 257/72

(58) Field of Classification Search .............. 257/72; 349/187; 438/169, 151, 142, 69
See application file for complete search history.

(56) References Cited

U.S. PATENT DOCUMENTS

| | | | |
|---|---|---|---|
| 4,782,380 A * | 11/1988 | Shankar et al. | 257/751 |
| 6,372,665 B1 * | 4/2002 | Watanabe et al. | 438/780 |
| 2007/0057260 A1 * | 3/2007 | Lee | 257/72 |
| 2008/0241980 A1 * | 10/2008 | Kobayashi et al. | 438/30 |

* cited by examiner

*Primary Examiner* — Thanh V Pham
*Assistant Examiner* — Errol Fernandes
(74) *Attorney, Agent, or Firm* — Blakely, Sokoloff, Taylor & Zafman LLP

(57) ABSTRACT

A method is provided for fabricating an image sensor array in a manner that reduces the potential for defects resulting from electrostatic discharge events during fabrication of the image sensor array. The method includes: forming at least one pixel over a substrate, the pixel including a switching transistor and a photo-sensitive cell; and forming a dielectric interlayer over the pixel. A key step in the method of the present invention is depositing a first conductive layer over the dielectric interlayer. After the first conductive layer is formed, the image sensor array is well protected from ESD events because the first conductive layer spreads out any charge induced by tribo-electric charging events that may occur during subsequent fabrication processing steps, thereby reducing the potential for localized damage to the switching transistors upon the occurrence of ESD events.

30 Claims, 6 Drawing Sheets

ESD INDUCED ARTIFACT REDUCTION DESIGN FOR A THIN FILM TRANSISTOR IMAGE SENSOR ARRAY

FIELD OF THE INVENTION

The present invention relates generally to techniques for reducing the potential for damage caused by electrostatic discharge ("ESD") during the fabrication of image sensor arrays. More particularly, the present invention relates to a method of fabricating image sensor arrays that reduces the potential for defects resulting from electrostatic discharge events during the fabrication process.

BACKGROUND

FIG. 1 shows a schematic circuit diagram illustrating a typical image sensor array at 10. The array 10 is formed on a substrate 12, and includes an active area 14 having a two-dimensional array of pixels 16 arranged in rows and columns. Each of the pixels 16 is fabricated on the substrate 12, which may be formed as a semiconductor substrate or a glass substrate (oriented in the plane of the drawing). While FIG. 1 only shows four pixels 16, it will be understood that the array 10 may include any number of pixels. Each of the pixels 16 is connected to a corresponding one of a plurality of gate lines 18, and to a corresponding one of a plurality of data lines 20. Each pixel 16 includes: a switching device 22; and a photo-sensitive cell 24 having a first terminal connected to a corresponding one of a plurality of voltage bias lines 28 to receive a bias voltage signal, $V_{BIAS}$. The switching device 22 may be implemented as a diode, a transistor or any other switching device. In the depicted example, the switching device 22 is a switching transistor including: a gate 30 connected to a corresponding one of the gate lines 18; a source 32 connected to a second terminal of the corresponding photo-sensitive cell 24 in the pixel; and a drain 34 connected to a corresponding one of the data lines 20. For certain applications, the switching transistor 22 may be implemented as an amorphous silicon ("a-Si") thin-film-transistor ("TFT"). The switching transistor 22 in each pixel provides for switching the pixel 16 on and off under control of the corresponding gate line 18 that is connected to the gate 30 of the switching transistor 22.

During operation, the photo-sensitive cell 24 converts radiation (e.g., light or X-ray) into an electrical charge that may be stored, and ultimately converted into an electrical signal transmitted via a corresponding one of the data lines 20. The switching transistor 22 controls the charge read out of each photo-sensitive cell 24. Commonly, the photo-sensitive cell 24 is implemented as a photo-diode.

It has been observed that most common switching transistors 22, including a-Si TFT's, are sensitive to electro-static discharge ("ESD"). ESD events often occur during fabrication and later assembly of image sensor arrays. Therefore, ESD protection is needed for achieving yield and robustness in fabrication of image sensor arrays.

ESD-induced artifacts present a significant quality concern in the fabrication of image sensor arrays 10 formed on insulating substrates 12. Small variations in the threshold voltage of the switching transistors 22 caused by localized discharges to the surface of an image sensor array can lead to visible artifacts in the charge image which is produced when the array of pixels 16 addressed by these switching transistors is read out. Prior art has focused on protecting the array 10 through guard rings encircling the array and protection to the gate lines 18, such as shorting bars, back-to-back TFTs, and other protection diode structures connected to the periphery of each array. See, e.g., U.S. patent application Ser. No. 11/019,739, published May 4, 2006. These approaches provide protection from charging of the gate lines 18 during fabrication and assembly of an image sensor array 10. However, as explained below, these systems and methods do not provide adequate ESD protection for image sensor arrays during stages of fabrication prior to formation of the data lines 20 and voltage bias lines 28.

ESD events may occur during many different stages of the manufacture of image sensor arrays 20. One point in the fabrication process for image sensor arrays which has proven to be insufficiently protected from ESD events is the photolithographic patterning of the interlayer dielectric into via contact holes. This point in the process poses a unique vulnerability which is not obvious to those of ordinary skill in the art. When forming a switching transistor for an active matrix liquid crystal display ("AMLCD"), a fabrication process typically involves: depositing and patterning a gate electrode; depositing chemical vapor deposition ("CVD") layers to form a gate dielectric (e.g., Silicon Nitride), a semiconducting layer (e.g., amorphous silicon ("a-Si")), and etch stopper (typically Silicon Nitride) or doped contact (typically n+ a-Si) layers; and depositing a top metal to form the data lines and voltage bias lines. In this sequence, the switching transistor is vulnerable to localized ESD when the a-Si and n+ layers are patterned into individual islands and prior to interconnection with the top metal.

In the case of an image sensor array using TFT's for switching transistors, additional thick interlayer dielectric is added to isolate the data lines 20 from the underlying gate lines 18 to minimize capacitance. A typical process includes depositing and etching the gate metal, depositing CVD layers to form the switching transistors (e.g., TFTs), patterning an island in the etch stopper layer (leaving the a-Si continuous), and then depositing a sequence of a doped n+ a-Si layer, a chrome ("Cr") layer, a n+ doped-intrinsic-p+ doped ("nip") layer sequence, and an indium-tin-oxide ("ITO") transparent conducting layer. In this part of the process, the a-Si is shunted by n+, Cr, and the top surface is shunted by ITO, rendering the plate insensitive to ESD. Once the photo-sensitive cells are patterned and the source and drain electrodes are patterned, the switching transistors are isolated and become vulnerable to ESD. At this point, a thick interlayer dielectric (e.g., Silicon Oxynitride) is deposited and patterned into vias. A top layer of metal is then deposited and patterned into the data lines 20 and bias lines 28, and then a top passivation layer of silicon oxynitride is deposited and patterned.

FIG. 2 shows a cross section of a pixel 38 of a partially fabricated image sensor array structure 40 as it exists during one of the above-described stages of fabrication that has proven to be insufficiently protected from ESD events. The pixel 38 of the partially fabricated image sensor array 40 includes: an at least partially fabricated switching transistor structure 42 formed over a substrate 12; an at least partially fabricated photo-sensitive cell structure 44 formed over the substrate 12; and a dielectric interlayer 46 formed over the structures 42 and 44. The stage of fabrication depicted in FIG. 2 is prior to photolithographic patterning and etching of the dielectric interlayer 46 to form via contact holes for connecting the data lines and voltage bias lines. During the stage shown in FIG. 2, the pixels 38 are electrically isolated from each other because the data lines 20 and voltage bias lines 28 have yet to be formed. As will be explained below, the image sensor array 40 is particularly susceptible to ESD damage while it is in the state of partial fabrication depicted in FIG. 2.

As will be understood by those of ordinary skill in the art, the switching transistor structure 42 and the photo-sensitive cell structure 44 may be formed in accordance with many different prior art processes. By way of example, the switching transistor structure 42 may include: a gate electrode 50 (e.g., a metal gate comprising titanium-tungsten ("Ti—W"), Ta, or Mo)) formed over the substrate 12; a gate dielectric 52 (e.g., a layer of silicon nitride) formed over the gate electrode 50 and over the substrate 12; a layer of amorphous silicon ("a-Si") 54 formed over the gate dielectric 52, and above the gate electrode 50; an etch stopper 56 (e.g., a layer of silicon nitride or a layer of n-doped amorphous silicon) formed over the layer of amorphous silicon 54; a source electrode 58 (e.g., a layer of n+ a-Si or microcrystalline Si covered with a contact metal like chrome) formed over the gate dielectric 52, adjacent the etch stopper 56 and amorphous silicon 54; and a drain electrode 60 (e.g., a layer of n+ a-Si or microcrystalline Si covered with a contact metal like chrome) formed over the gate dielectric 52, and adjacent the etch stopper 56 and amorphous silicon 54. As will be understood by those of ordinary skill in the art, a switching transistor structure 42 may be formed in accordance with many different techniques, and may be structured in many different ways. As also will be understood by those of ordinary skill in the art, and by way of example only, the partially fabricated photo-sensitive cell structure 44 may include: an n-type doped amorphous silicon layer 61 formed over a portion of the source electrode 58; an intrinsic amorphous silicon layer 62 formed over the layer 61; a p-type doped amorphous silicon layer 64 formed over the layer 62; and a top electrode layer 66 formed over the layer 64. Commonly, the top transparent electrode layer 66 is formed from indium-tin-oxide ("ITO") or indium-zinc-oxide ("IZO"). However, other materials may be used to form the top electrode layer. The source electrode 58 of the switching transistor also serves as a bottom electrode of the photo-sensitive cell structure 44.

FIG. 3 shows a simplified perspective view at 70 of a partially fabricated image sensor array structure 40 as it exists during one of the above-described stages of fabrication that has proven to be insufficiently protected from ESD events. As shown in FIG. 3, the fabricated image sensor array structure 40 includes an array of pixels 16, each including the at least partially fabricated switching transistor and photo-sensitive cell structures formed over the substrate 12. In the depicted stage of fabrication, gate lines 18 have been formed, but the data lines 20 (FIG. 1) and voltage bias lines 28 (FIG. 1) have yet to be formed. During this stage of the fabrication process, the switching transistor structures 42 are electrically isolated. Therefore, the above-described prior art ESD protection measures (e.g., use of protection diode structures) are generally not sufficient to protect the partially fabricated image sensor array structure 40 from ESD events.

In accordance with typical prior art methods for fabricating image sensor arrays, the partially fabricated image sensor array structure 40 (FIGS. 2 and 3) is subjected to subsequent processing steps including photolithographic patterning of the dielectric interlayer 46 (FIG. 2) to create contact holes for purposes of connecting the drain electrode 60 (FIG. 2) and top electrode layer 66 (FIG. 2) to data lines and voltage bias lines respectively. During subsequent processing steps performed on the array 40 (e.g., the aforementioned patterning of the interlayer dielectric 46 to create via contact holes), it has been found that electrostatic discharges to either the front surface 11 or back surface 13 of the insulating substrate 12 can cause localized damage to the switching transistor structures 42 (FIG. 2), which leads to significant ESD artifacts. This type of damage can be caused during fabrication processing steps in which the substrate 12 is charged up to a high potential and moves close to a metallic point somewhere in the fabrication process, causing an electrostatic shock to the surface of the substrate 12.

A typical image sensor array fabrication processing line includes multiple process stations and various types of apparatus for moving the substrate 12 from one station to another. Referring to FIG. 3, such apparatus may include a pin 71, which lifts the substrate 12 from a platen (not shown). Often, the pin 71, platens and other levers used in the process stations are made of dissimilar materials. In such environments, arcing 72 may occur to the back side 13 of the substrate 12 when it is removed from lift pin 71 and transferred from one process station to the next. If the switching transistors 42 are electrically isolated, as they are during the patterning of the interlayer dielectric 46 (FIG. 2), then the charge induced on the back side 13 of the substrate 12 will cause high potentials on the top surface 11 and cause localized damage to the switching transistors 42 (FIG. 2) proximate the discharge event.

Due to the insulating nature of the substrate 12 and the fact that the pixels 16 are electrically isolated prior to top metal interconnection, any discharge 72 to the back surface 13 of the substrate 12 is localized to the immediate vicinity of the discharge event. As explained, such events can occur during typical fabrication processing steps in which the substrate 12 separates from a dissimilar material and develops tribo-electric charge. If not adequately discharged by ionizers, the substrate 12 can charge up to 10-20 kV surface potential, and thereby become highly vulnerable to ESD events.

FIG. 4 shows a charge image of an image sensor array at 78 having ESD induced artifacts 79. Often, these artifacts are caused by localized discharges to the surface of the image sensor array during various fabrication steps such as those described above.

FIG. 5 shows a schematic circuit diagram of an equivalent circuit for modeling the response of one of the pixels 38 (FIG. 2) to a triboelectric charging event 72 localized at the back surface 13 of the substrate 12. The equivalent circuit includes: a first capacitor 84, having a first capacitance value $C_1$, connected between a gate node 85 representing the gate electrode 50 (FIG. 2) and a source node 86 representing the source electrode 58 (FIG. 2); and a second capacitor 88, having a second capacitance value $C_2$ that is much greater than the first capacitance value $C_1$, connected between the source node 86 and a node 90 representing the top electrode layer 66 (FIG. 2). The first capacitance value $C_1$ represents the capacitance between the gate electrode 50 (FIG. 2) and the source electrode 58 (FIG. 2). Note that in the unprotected case, the source node 86 representing the source electrode 58 (FIG. 2) is electrically isolated in the partially fabricated image sensor array 40. The second capacitance value $C_2$ represents the capacitance between the source electrode 58 (FIG. 2) and the top electrode layer 66 (FIG. 2). The voltage value $V_0$ represents the voltage between the gate electrode 50 (FIG. 2) and the back side 13 (FIG. 2) of the substrate. The voltage value $V_{gd}$ represents the voltage between the source electrode 58 (FIG. 2) and the gate electrode 50 (FIG. 2).

When the pixel 38 (FIG. 2) of the partially fabricated image sensor array 40 (FIG. 2) is subjected to a tribo-electric charging event 72 (FIG. 3) applied to the back side 13 of the substrate, the back side 13 can be charged to a high voltage. When the substrate separates from a smooth surface, the back side 13 of the substrate may be charged to a voltage that is in the approximate range of 10-20 kV. Both the source electrode 58 (FIG. 2) and the gate electrode 50 (FIG. 2) will have the same electrical potential (or voltage) if there is no grounded conductor close to the substrate. Referring again to FIG. 3, when a grounded conductive pin 71 is close to the back side 13 of the substrate, the "gate voltage" (i.e., the voltage at the gate electrode 50 (FIG. 6) relative to the drain electrode 60 of the switching transistor) won't drop much since the gate line 18 is long and has a relatively high capacitance compared to an individual pixel. The "voltage of the diodes" (i.e., the voltage between the source electrode 58 and gate electrode 50) of one or more switching transistors around the pin 71 will drop substantially. The final voltage on the diode is determined by the ratio of "pin-diode capacitance" (i.e., the capacitance between the top electrode 66 and the source electrode 58, which is the capacitance of the nip diode structure 44) and the "diode-gate capacitance" (i.e., the capacitance between the source electrode 58 and gate electrode 50 of the switching transistor) as a voltage divider. Switching transistors 44 (FIG. 2) around the pin will see a voltage across the gate electrode 50 (FIG. 2) and source electrode 58 (FIG. 2). This voltage can be as high as several hundred volts and can stress the switching transistors 44 (FIG. 2) and create stress marks. Similarly, voltage charging to the top surface of the plate will cause the top electrode 66 to capacitively induce voltage across the gate electrodes 50 and drain electrodes 60 of the switching transistors, also leading to ESD damage. The improvements in this invention also address ESD caused to the top side of the dielectric interlayer 46.

When a pixel of the partially fabricated image sensor array 40 (FIG. 2) is subjected to the tribo-electric charging event 82 applied to the back side 13 of the substrate 12 proximate the pixel 38, the source electrode 58 (FIG. 2) is charged to a high voltage $V_{gd}$ that is approximately equally to $V_o$. In this unprotected case, the tribo-electric charging event 82 causes variations in the threshold voltage of the switching transistor 42 (FIG. 2), which can lead to the visible artifacts 79 (FIG. 4) in the image sensor array when the array of pixels addressed by these switching transistors is read.

One prior art method for mitigating this problem is to provide a conducting film (e.g., ITO or other thin metal) on the back side 13 of the substrate 12, which will spread out the charge caused by ESD events over the entire plate surface and prevent localized image artifacts. However, this prior art solution has the disadvantage that certain dry etch tools used to pattern the interlayer dielectric 46 (FIG. 2) rely on an electrostatic chuck to provide adequate thermal contact and cooling during the etch process. Such electrostatic chucks can only be used with insulating substrates and do not provide adequate clamping forces when the back side 13 of the substrate is coated with a conducting metal. This means that the backside metal may need to be etched off (e.g., a wet etch process) prior to dry etching the vias, which adds extra process complications. Therefore, the prior art method adds undesirable complexities to the fabrication processes.

Accordingly, it is an object of the present invention to provide a method and apparatus for fabricating an image sensor array that reduces the potential for creating ESD-induced artifacts during stages of the fabrication process when the partially fabricated switching transistor structures in the pixels are electrically isolated from each other. As an example, it is an object of the present invention to provide a method and apparatus for fabricating image sensor arrays that reduces the potential for creating ESD-induced artifacts during photolithographic patterning of the interlayer dielectric to create contact holes.

It is a further object of the present invention to provide a method and apparatus for fabricating image sensor arrays that reduces the potential for creating ESD-induced artifacts without adding any extra process complications.

SUMMARY

The present invention provides a method of fabricating an image sensor array that reduces the potential for defects resulting from electrostatic discharge events during fabrication of the image sensor array. The method includes the initial steps of: providing an insulating substrate; forming at least one pixel over the substrate, the pixel including a switching transistor and a photo-sensitive cell; and forming a dielectric interlayer over the switching transistor and the photo-sensitive cell. In on embodiment, the switching transistor includes a gate electrode, a source electrode and a drain electrode. The photo-sensitive cell includes a top electrode and a bottom electrode. The present invention is not limited to any particular process for fabricating the switching transistor and the photo-sensitive cell, and is not limited to any particular structures or materials for forming the switching transistor and photo-sensitive cell.

A key step in the method of the present invention is depositing a first conductive layer over the dielectric interlayer. After the first conductive layer is formed, the image sensor array is well protected from ESD events because the first conductive layer spreads out any charge-induced by tribo-electric charging events that may occur during subsequent fabrication processing steps, thereby reducing the potential for localized damage to the switching transistors upon the occurrence of ESD events.

After depositing the first conductive layer, additional fabrication processing steps can be performed with less risk of ESD damage. These additional steps may include: (a) forming a via-patterned photoresist layer over the first conductive layer; (b) etching first and second vias in and through the first conductive layer and the dielectric interlayer using the photoresist layer, the first via exposing a portion of the drain electrode, the second via exposing a portion of the top electrode; (c) depositing a second conductive layer over the first conductive layer, over inner walls of the first and second vias, and over the exposed portions of the drain electrode and the top electrode; and (d) etching away portions of the second conductive layer and the first conductive layer to form data lines that provide electrical contact with the drain electrode, and voltage bias lines that provide electrical contact with the top electrode. In performing this method, the pixels of the image sensor array are substantially protected from electrostatic discharge events by the presence of the first conductive layer deposited over the dielectric interlayer. In accordance with one aspect of the present invention, the first conductive layer is etchable by the same process employed in the etching of steps (b) and (d).

These and other features, aspects and advantages of the present invention will become better understood from the description herein, appended claims, and accompanying drawings as hereafter described.

BRIEF DESCRIPTION OF THE DRAWINGS

The accompanying drawings, which are incorporated in and constitute a part of this specification, illustrate several embodiments of the invention and together with the description, serve to explain the principles of the invention. Wherever convenient, the same reference numbers will be used throughout the drawings to refer to the same or like elements.

DETAILED DESCRIPTION OF THE PREFERRED EMBODIMENT

Figure 2:
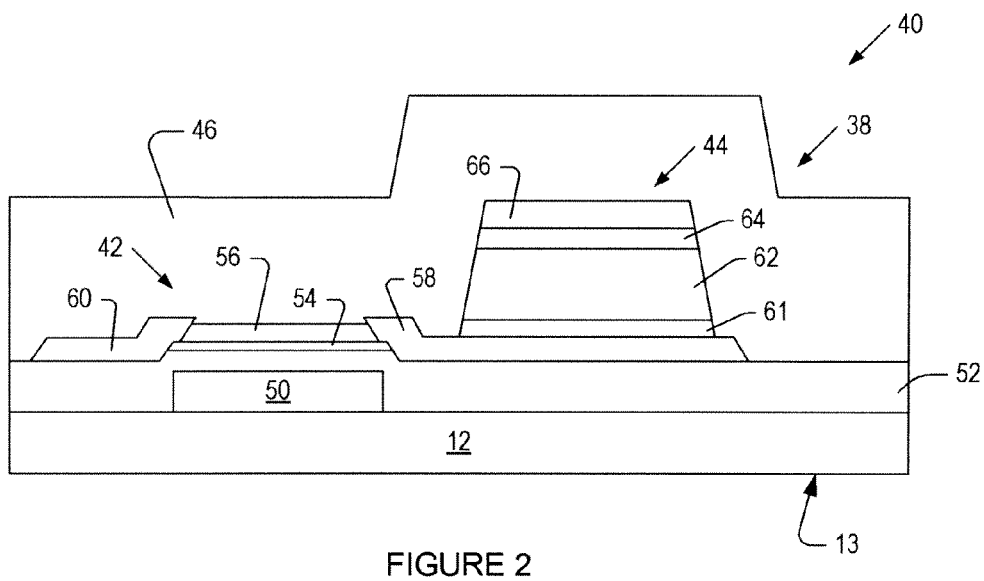
FIG. 2 shows a cross sectional view of a pixel of a partially fabricated image sensor array structure as it exists during a stage of prior art fabrication processes that is particularly susceptible to damage caused by ESD events.

Precursor steps to the novel aspects of the method of the present invention include providing a partially fabricated image sensor array 40, such as the one shown in FIG. 2. The partially fabricated image sensor array 40 includes a pixel 38 having: an at least partially fabricated switching transistor structure 42 formed over a substrate 12; an at least partially fabricated photo-sensitive cell structure 44 formed over the substrate 12; and a dielectric interlayer 46 formed over the structures 42 and 44. The partially fabricated switching transistor structure 42 and photo-sensitive cell structure 44 may be formed in accordance with any prior art fabrication techniques, such as the one described above. However, the present invention is not limited to any particular process for fabricating the switching transistor structure 42 and photo-sensitive cell structure 44, and is also not limited to the structures and materials described above for the switching transistor structure 42 and photo-sensitive cell structure 44, which are only given as examples. Those of ordinary skill in the art will appreciate that there are many methods of fabrication, structures and materials that may be employed to provide a switching transistor structure and a photo-sensitive cell structure with dielectric interlayer formed over the structures.

Figure 1:
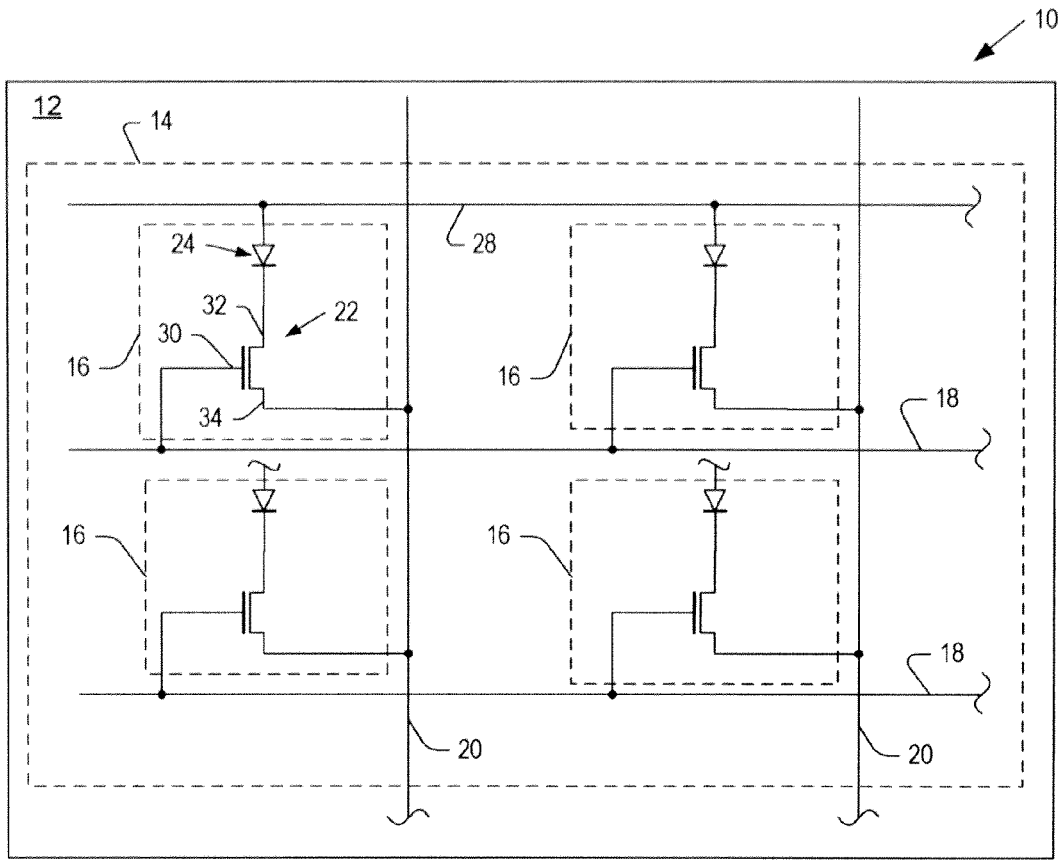
FIG. 1 is a schematic circuit diagram illustrating a typical image sensor array.

Referring again to FIG. 2, as explained above, pixels 38 of the partially fabricated image sensor array structure 40 (FIG. 2) are susceptible to ESD damage because the pixels 38 are electrically isolated before data lines 20 (FIG. 1) and voltage bias lines 28 (FIG. 1) are formed. As mentioned above, the partially formed image sensor array is particularly susceptible to ESD damage during subsequent steps including photolithographic patterning of the dielectric interlayer 46 into via contact holes. A solution in accordance with the present invention is to deposit a conductive layer on the top surface of the partially fabricated image sensor array 40 (FIG. 2), which covers the interlayer dielectric 46 (FIG. 2).

Figure 6:
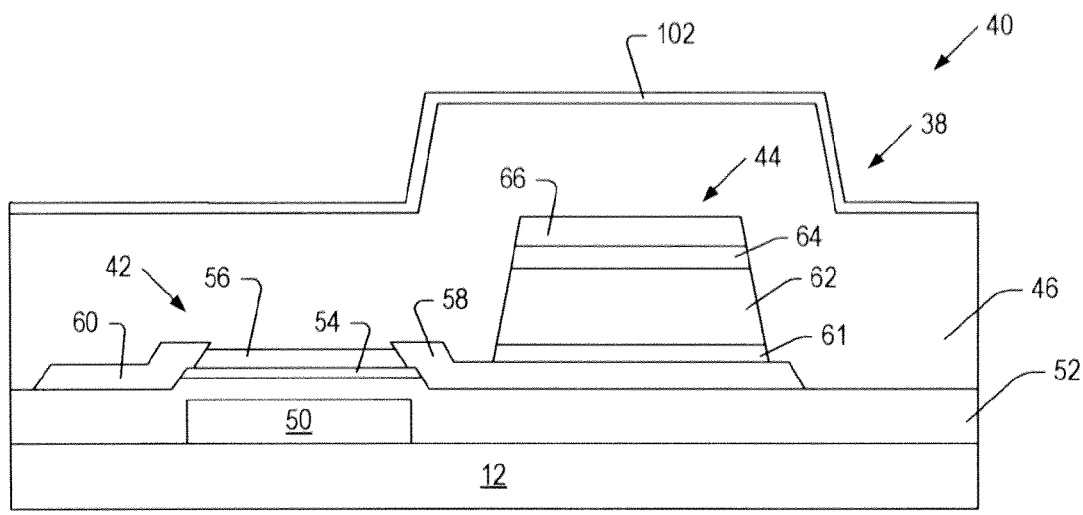
FIGS. 6-10 depict a series of steps in accordance with the method of the present invention for fabricating an image sensor array that reduces the potential for creating ESD-induced artifacts in the array during stages of the fabrication process preceding formation of data lines and voltage bias lines.

FIG. 6 shows a first step in the method of the present invention for fabricating an image sensor array in a manner that reduces the potential for creating ESD-induced artifacts. In the first step, a first conductive layer 102 is formed over the dielectric interlayer 46 of the partially fabricated image sensor array 40 (FIG. 2). After the first conductive layer 102 is formed over the dielectric interlayer 46, the image sensor array structure 40 is well protected from ESD events because the first conductive layer 102 spreads out any charge-induced by tribo-electric charging events that may occur during subsequent fabrication processing steps, thereby eliminating or alleviating localized damage to the switching transistors 42.

In one embodiment, the first conductive layer 102 is formed of titanium-tungsten (TiW). In this embodiment, the first conductive layer is formed to have a thickness in the range of 50 Å to 500 Å. In other embodiments, the first conductive layer 102 may be formed from molybdenum ("Mo") or tantalum ("Ta") or any other metal that is etchable in an F-containing plasma. Also, in an embodiment, the first conductive layer 102 is formed by a physical vapor deposition ("PVD") process. In another embodiment, the first conductive layer 102 is formed using a sputtering process. In yet another embodiment, the first conductive layer 102 may be formed using a material that can be etched during a subsequent top metal patterning step, as further described below.

Figure 7:
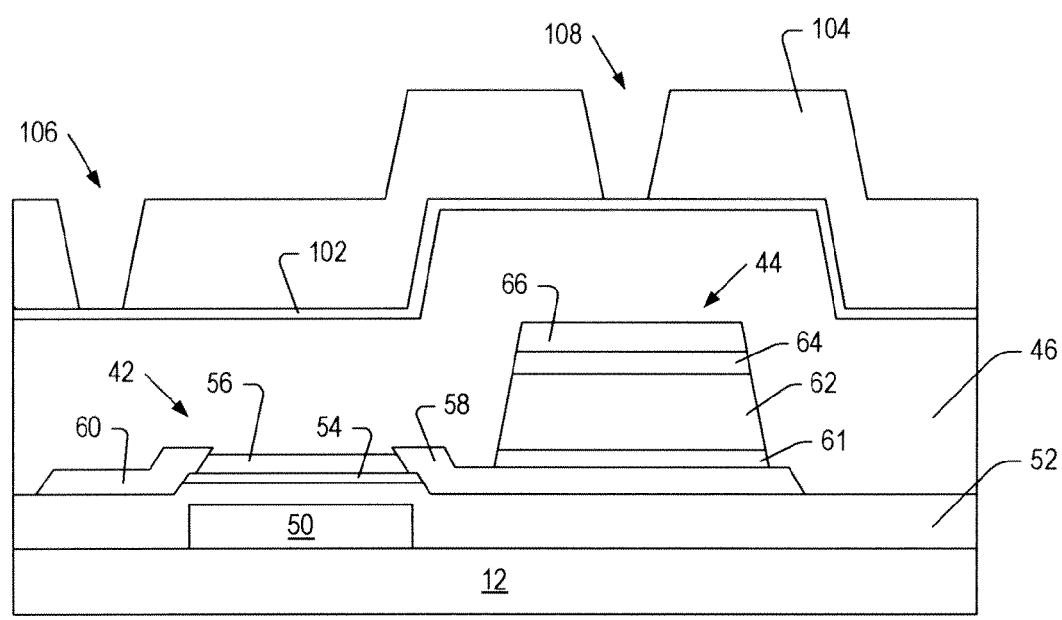

FIG. 7 depicts a second step in the method of the present invention, which includes the formation of a via-patterned photoresist layer 104 over the first conductive layer 102. As shown in FIG. 7, and as further described below, the photoresist layer 104 is patterned to facilitate a subsequent etching step that will result in the formation of a first contact via proximate a first area 106 formed above a portion of the drain electrode 60, and the formation of a second contact via proximate a second contact area 108 formed above a portion of the top electrode 66. The first and second contact areas 106 and 108 may be formed using photolithographic techniques.

Figure 8:
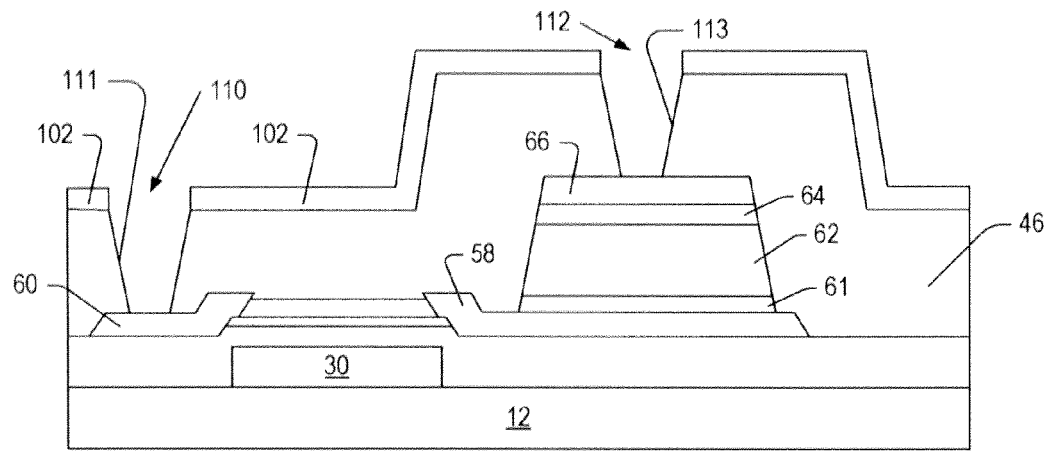

FIG. 8 depicts the results of performing a third step in the method of the present invention, which includes use of the via-patterned photoresist layer 104 (FIG. 7) to etch first and second contact vias 110 and 112 in and through the first conductive layer 102 and the dielectric interlayer 46. In the depicted embodiment, this etching step results in exposure of inner walls 111 and 113 of the first and second contact vias 110 and 112 respectively, and also exposure of portions of the drain electrode 60 and portions of the top electrode layer 66 located beneath the contact vias 110 and 112 respectively. Also, in an embodiment, this etching step is performed in accordance with dry etching techniques. In another embodiment, this etching step is performed in accordance with wet etching techniques. In the described embodiment, the first conductive layer 102 is formed from a material that can be etched along with etching of the dielectric interlayer 46 so as to prevent any top metal overhang proximate the inner walls 111 and 113 of the first and second contact vias 110 and 112.

Figure 9:
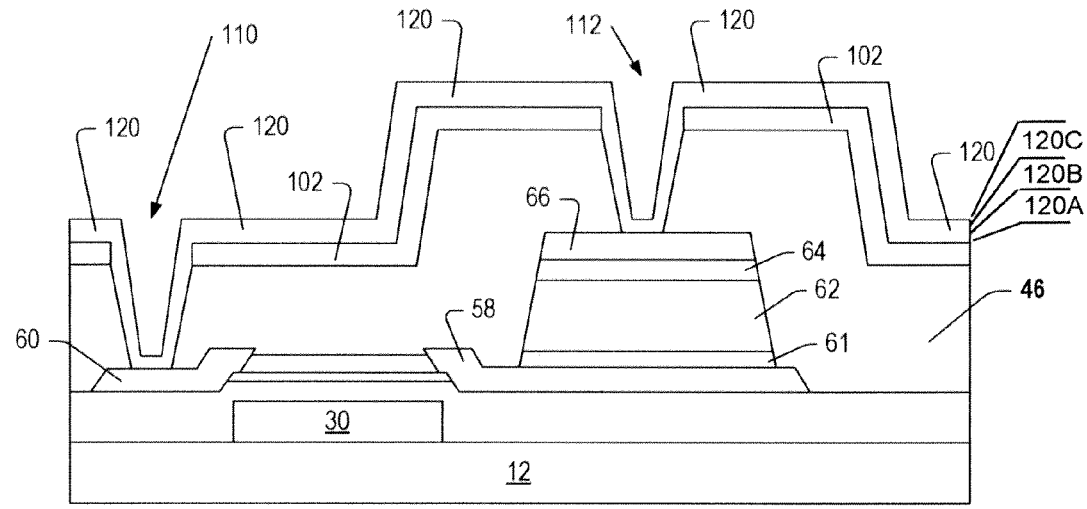

FIG. 9 shows the results of performing a fourth step in the method of the present invention, which includes depositing a second conductive layer 120 over the remaining portions of the first conductive layer 102, over the inner walls 111 and 113 of the first and second vias 110 and 112, and over the previously exposed portions of the drain electrode 60 and top electrode 66. In one embodiment, the second conductive layer 120 is a metal layer. Also, in an embodiment, the second conductive layer 120 is formed at least partly from a material that it is identical to the material of the first conductive layer 102. The second conductive layer 120 forms an electrical contact with the previously exposed portions of the drain electrode 60 and top electrode layer 66 located beneath the contact vias 110 and 112 respectively.

In one embodiment, the second conductive layer 120 includes two sub-layers. For example, the second conductive layer 120 may include: a first sub-layer 120A formed over the remaining portions of the first conductive layer 102, over the inner walls 111 and 113 of the first and second vias 110 and 112, and over the previously exposed portions of the drain electrode 60 and top electrode 66; and a second sub-layer 120B formed over the first sub-layer. In one embodiment, the first sub-layer 120A is formed from TiW, and the second sub-layer 120B is formed from aluminum ("Al") with a thickness in the range of 0.25 to 1.0 um. In another embodiment, the first sub-layer 120A is formed from Mo, and the second sub-layer 120B is formed from aluminum ("Al") with a thickness in the range of 0.25 to 1.0 um. In these embodiments, which use two sub-layers to form the second conductive layer 120, the first sub-layer 120A of TiW or Mo is used as a diffusion barrier to prevent alloying of the second sub-layer 120B of Al with the underlying electrode layer 66, and the second sub-layer 120B of Al is added to reduce the line resistance. In yet another embodiment, the second conductive layer 120 may contain a third sub-layer 120C of Mo or TiW formed over the second sub-layer 120B of Al to protect the second sub-layer 120B of Al from exposure to further corrosive processes.

In an embodiment, the second conductive layer 120 is formed by a physical vapor deposition ("PVD") process. For example, the second conductive layer 120 may be formed using a sputtering process. As explained below, the first conductive layer 102 must be compatible with the etching requirements of the second conductive layer 120. For example, the first conducting layer 102 may be thin compared to the second conductive layer 120 so that process time and line width control is not substantially affected by the presence of the first conductive layer 102.

In the embodiment mentioned above, in which the first conductive layer 102 comprises TiW, the first conductive layer 102 can be dry etched at the same time as the dielectric interlayer 46 is patterned, and it can be wet etched as part of the etching of the second conductive layer 120. The image sensor array is well protected from the point the first conductive layer 102 is deposited until the second conductive layer 120 is patterned, at which point the entire array is interconnected and much less vulnerable to ESD. The first conductive layer 102 left under the second conductive layer 120 is completely compatible with the electrical and etching requirements of the top metal layer.

Figure 10:
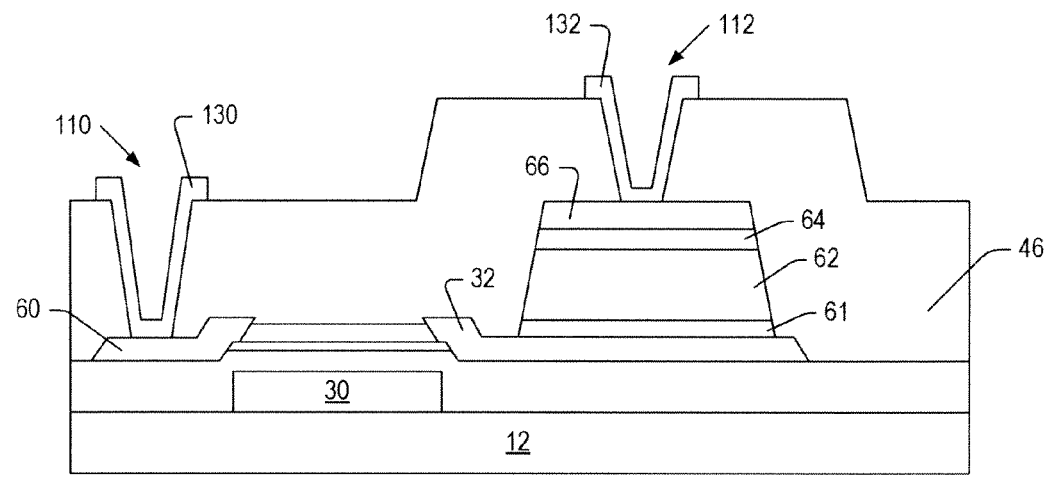

FIG. 10 shows the results of performing a fifth step in the method of the present invention, which includes etching away portions of the second conductive layer 120 to form data lines 130 and voltage bias lines 132 that provide electrical contact with the portions of the drain electrode 60 and top electrode layer 66 located beneath the first and second contact vias 110 and 112 respectively. In one embodiment of the present invention, the etching of the second conductive layer 120 is performed using a wet etching process. However, the etching of the second conductive layer 120 may alternatively be performed using a dry etching process. Preferably, if the etching of the first conductive layer 102 (depicted in FIG. 8) is performed using a wet etching process, then the etching of the second conductive layer 120 is performed using a dry etching process. Conversely, if the etching of the first conductive layer 102 (depicted in FIG. 8) is performed using a dry etching process, then the etching of the second conductive layer 120 is performed using a wet etching process. Note that the etching of the second conductive layer 120 and underlying first conductive layer 102 does not substantially remove the dielectric interlayer 46.

The etching of the first conductive layer 102 and underlying interlayer dielectric 46 (depicted in FIG. 8) can be either wet or dry, as long as well-controlled contact vias 110 can be formed through the two layers 102 and 46. The etching of the second conductive layer 120 and underlying first conductive layer 102 can be done either wet or dry, as long as the line definition is well-controlled and the underlying interlayer dielectric 46 is not etched significantly by this etch process. In one embodiment, the second etch (i.e., the etching of the second conductive layer 120 and underlying first conductive layer 102 depicted in FIG. 10) can be a wet etch with a chemistry that does not etch the interlayer dielectric 46. In another embodiment, the second etch can be a dry etch (i.e., the etching of the second conductive layer 120 and underlying first conductive layer 102 depicted in FIG. 10) with a process which is known to selectively etch the metal layers 102 and 120 and not etch the interlayer dielectric 46.

Figure 11:
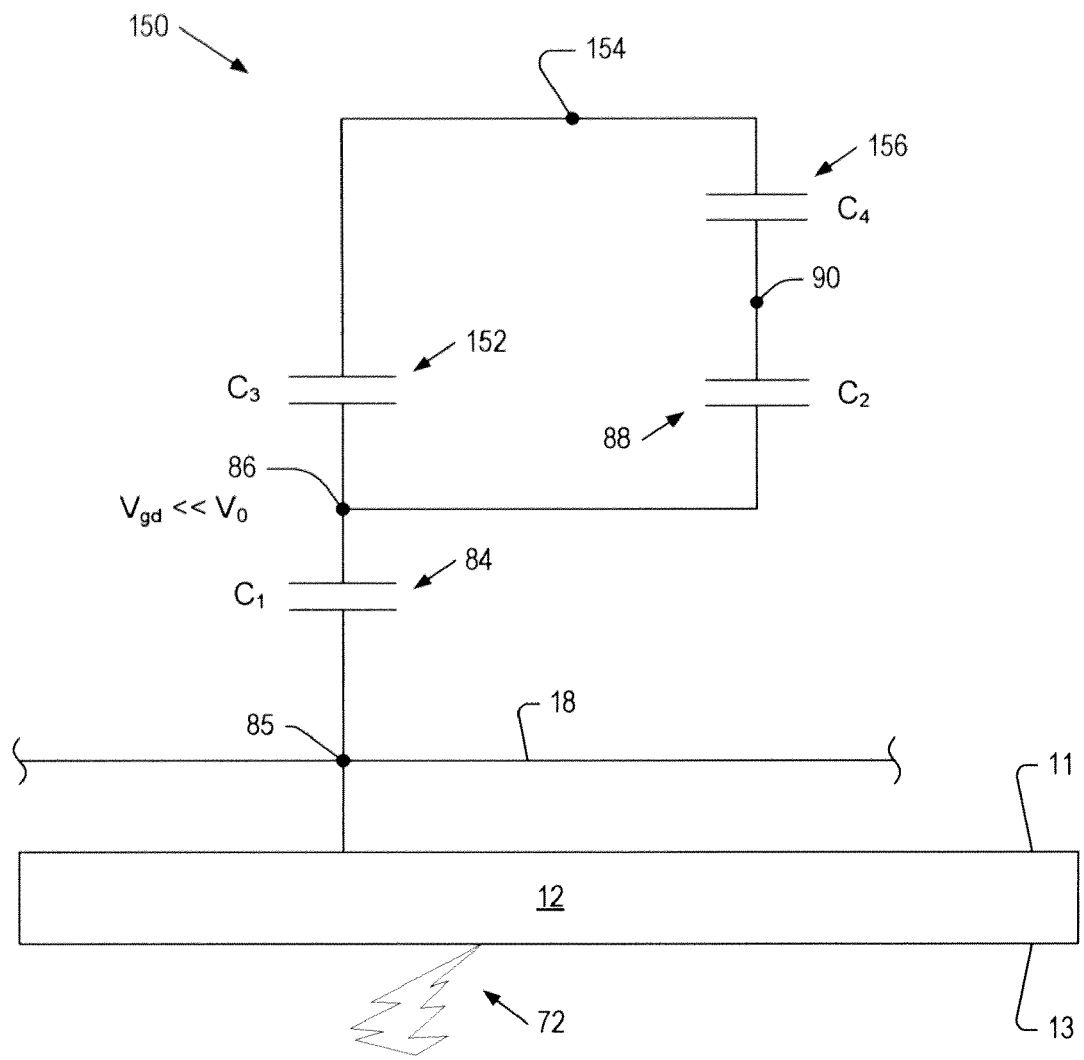
FIG. 11 is a schematic circuit diagram of an equivalent circuit for modeling an ESD response of a partially fabricated image sensor array structure formed in accordance with the fabrication method of the present invention.

FIG. 11 shows a schematic circuit diagram at 150 of an equivalent circuit for modeling the improved response of one of the pixels 38 (FIG. 6) to a triboelectric charging event 72 localized at the back surface of the substrate 12 of the partially fabricated image sensor array structure 40 (FIG. 6) proximate the pixel after the first conductive layer 102 (FIG. 6) has been formed over the dielectric interlayer 46 in accordance with the present invention as shown in FIG. 6. The equivalent circuit 150 includes: a first capacitor 84, having a first capacitance value $C_1$, connected between a gate node 85 representing the gate electrode 50 (FIG. 6) and a source node 86 representing the source electrode 58 (FIG. 6); a second capacitor 88, having a second capacitance value $C_2$, connected between the source node 86 and a node 90 representing the top electrode layer 66 (FIG. 6); a third capacitor 152, having a third capacitance value $C_3$, connected between the source node 86 and a node 154 representing the first conductive layer 102 (FIG. 6); and a fourth capacitor 156, having a fourth capacitance value $C_4$, connected between the node 90 representing the top electrode layer and the node 154 representing the first conductive layer 102 (FIG. 6).

The first capacitance value $C_1$ represents the capacitance between the gate electrode 50 (FIG. 6) and the source electrode 58 (FIG. 6). The second capacitance value $C_2$ represents the capacitance between the source electrode 58 (FIG. 6) and the top electrode layer 66 (FIG. 6). The third capacitance value $C_3$ represents the capacitance between the source electrode 58 (FIG. 6) and the first conductive layer 102 (FIG. 6). The fourth capacitance value $C_4$ represents the capacitance between the top electrode layer 66 (FIG. 6) and the first conductive layer 102 (FIG. 6). The voltage value $V_0$ represents the voltage between the gate electrode 50 (FIG. 6) and the back side 13 (FIG. 6) of the substrate. The voltage value $V_{gd}$ represents the voltage between the source electrode 58 (FIG. 6) and the gate electrode 50 (FIG. 6).

When the pixel 38 (FIG. 6) of the partially fabricated image sensor array 40 (FIG. 6) is subjected to the tribo-electric charging event 72 applied to the back side 13 of the substrate 12 proximate the pixel 38, the source electrode 58 (FIG. 2) is charged to a voltage $V_{gd}$ that is less than the voltage value $V_0$.

Figure 3:
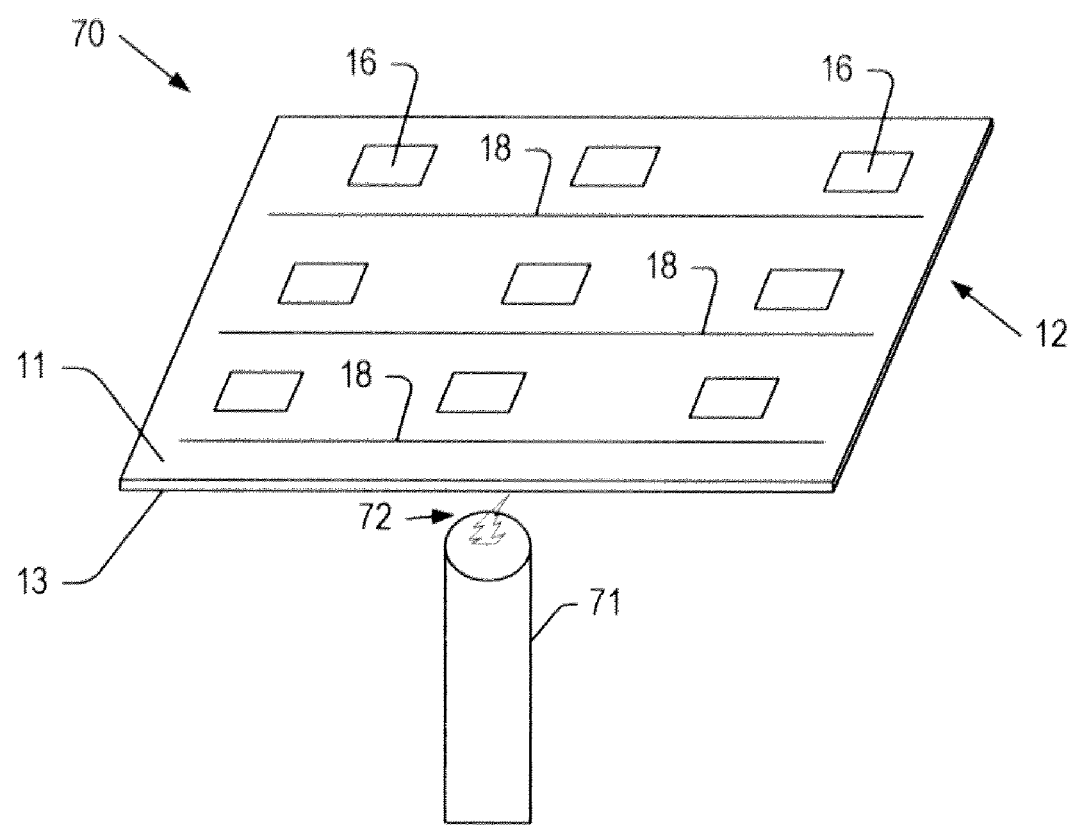
FIG. 3 is a simplified perspective view of the partially fabricated image sensor array structure of FIG. 2.
Figure 4:
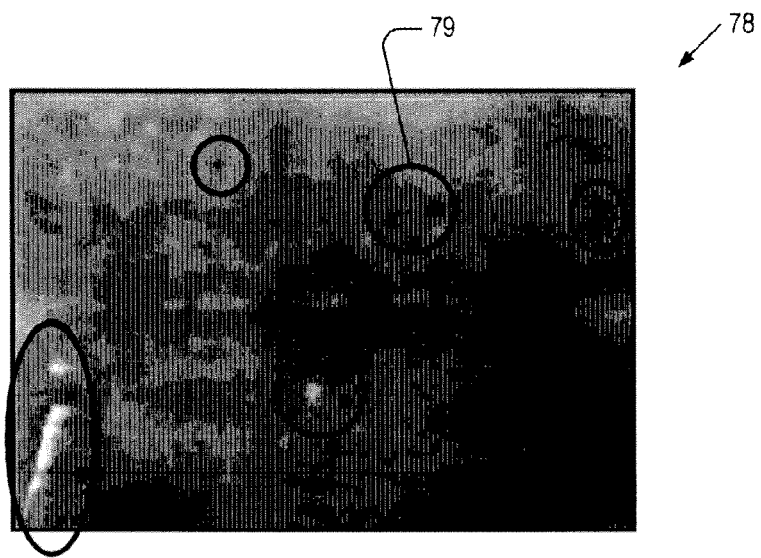
FIG. 4 is a charge image of an image sensor array having ESD induced artifacts.
Figure 5:
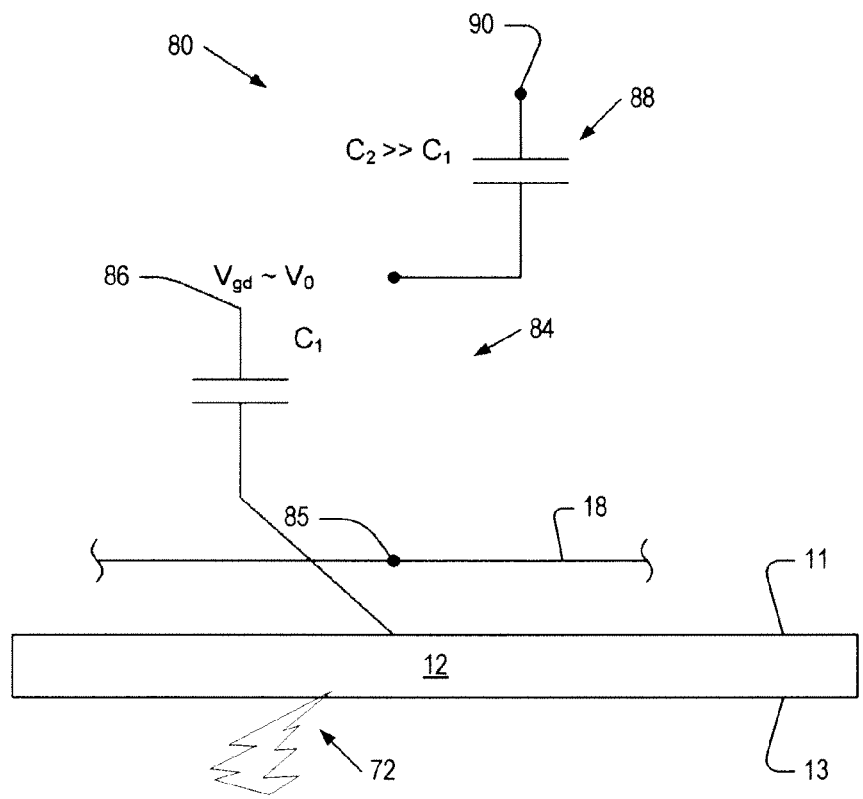
FIG. 5 is a schematic circuit diagram of an equivalent circuit for modeling the ESD response of a partially fabricated image sensor array structure formed in accordance with prior art fabrication processes.

As explained above, when the pixel 38 (FIG. 6) of the partially fabricated image sensor array 40 (FIG. 6) is subjected to a tribo-electric charging event 72 applied to the back side 13 of the substrate, the back side 13 can be charged to a high voltage. For example, when the substrate it separates from a smooth surface, the back side 13 of the substrate may be charged to a voltage that is in the approximate range of 10-20 kV. Both the source electrode 58 (FIG. 6) and the gate electrode 50 (FIG. 6) will have the same electrical potential (or voltage) if there is no grounded conductor close to the glass. However, when a grounded conductive pin 71 is close to the back side 13 of the substrate, the "gate voltage" (i.e., the voltage at the gate electrode 50 relative to the source electrode 58) won't drop much since the gate line 18 (FIG. 3) is long and has a relatively high capacitance compared to an individual pixel. The voltage of the source electrode 58 of the pixel around the pin 71 will drop substantially. The final voltage on the diode is determined by the ratio of "pin-diode capacitance" (i.e., the capacitance between the source electrode 58 and top electrode 66) and diode-gate capacitance (i.e., the first capacitance value $C_1$). Switching transistors 44

(FIG. 6) around the pin will see a voltage across the gate electrode 50 (FIG. 6) and source electrode 58 (FIG. 6). This voltage can be as high as several hundred volts and can stress the switching transistors 44 (FIG. 6) and create stress marks.

The first conductive layer 102 provides a very large capacitance between this layer and the source electrode 58 (FIG. 6). The second capacitance value $C_2$ in parallel with the fourth capacitance value $C_4$ is large compared to the first capacitance value $C_1$ (i.e., $C_2 \| C_4 \gg C_1$). This will prevent large voltages from developing across the switching transistors 44 (FIG. 6) and prevent ESD artifacts and blemishes. In the protected case of FIG. 6, the voltage value $V_{gd}$ (i.e., the voltage between the source electrode 58 and the gate electrode 50) is substantially lower than $V_0$, and it can be expressed by equation (1), below.

$$V_{gd} = V_0 \times [C_1 / \{C_1 + C_3 + C_2 C_4 / (C_2 + C_4)\}] \quad (1)$$

If the switching transistor 42 (FIG. 6) is relatively small, and the photosensitive cell 44 (FIG. 6) has a high capacitance, then the voltage value $V_{gd}$ may be expressed by equation (2), below.

$$V_{gd} \ll V_0 \text{ for } C_1 \ll C_2, C_4 \quad (2)$$

In sum, although the present invention has been described in considerable detail with reference to certain preferred versions thereof, other versions are possible. Any other number of combinations of the above described ESD devices is contemplated. Therefore, the spirit and scope of the appended claims should not be limited to the description of the preferred versions contained herein.

What is claimed is:

1. A method of fabricating an image sensor array that reduces the potential for defects resulting from electrostatic discharge events during fabrication, the method comprising:
   (a) providing an insulating substrate;
   (b) forming at least one pixel over the substrate, the pixel including a switching transistor and a photo-sensitive cell, the switching transistor having a gate electrode, a source electrode and a drain electrode, the photo-sensitive cell having a top electrode;
   (c) forming a dielectric interlayer over the switching transistor and the photo-sensitive cell;
   (d) depositing a first conductive layer over the dielectric interlayer;
   (e) forming a via-patterned photoresist layer over the first conductive layer;
   (f) etching first and second vias in and through the first conductive layer and the dielectric interlayer using the via-patterned photoresist layer, the first and second vias having inner walls formed by exposed portions of the first conductive layer and the dielectric interlayer, the first via exposing a portion of the drain electrode, the second via exposing a portion of the top electrode;
   (g) depositing a second conductive layer directly over the first conductive layer, over the inner walls of the first and second vias, and over the exposed portions of the drain electrode and the top electrode; and
   (h) etching away portions of the second conductive layer and the first conductive layer to form data lines that provide electrical contact with the drain electrode, and voltage bias lines that provide electrical contact with the top electrode;
   (i) whereby the pixels of the image sensor array are substantially protected from electrostatic discharge events by the presence of the first conductive layer deposited over the dielectric interlayer.

2. A method of fabricating an image sensor array as recited in claim 1, wherein the first conductive layer is formed of titanium-tungsten.

3. A method of fabricating an image sensor array as recited in claim 1, wherein the step (d) of depositing a first conductive layer includes performing a physical vapor deposition process.

4. A method of fabricating an image sensor array as recited in claim 1, wherein the step (g) of depositing a second conductive layer further includes:
   depositing a first sub-layer over the first conductive layer, over the inner walls of the first and second vias, and over the exposed portions of the drain electrode and the top electrode; and
   depositing a second sub-layer over the first sub-layer.

5. A method of fabricating an image sensor array as recited in claim 4, wherein:
   the first conductive layer is formed of titanium-tungsten;
   the first sub-layer is formed of titanium-tungsten; and
   the second sub-layer is formed of aluminum.

6. A method of fabricating an image sensor array as recited in claim 4, wherein:
   the first conductive layer is formed of molybdenum;
   the first sub-layer is formed of molybdenum; and
   the second sub-layer is formed of aluminum.

7. A method of fabricating an image sensor array as recited in claim 4, wherein the step (g) of depositing a second conductive layer further includes:
   depositing a third sub-layer over the second sub-layer.

8. A method of fabricating an image sensor array as recited in claim 7, wherein:
   the first conductive layer is formed of titanium-tungsten;
   the first sub-layer is formed of titanium-tungsten;
   the second sub-layer is formed of aluminum; and
   the third sub-layer is formed of titanium-tungsten.

9. A method of fabricating an image sensor array as recited in claim 1, wherein the first conductive layer is formed using a material that can be etched during the etching of steps (f) and (h).

10. A method of fabricating an image sensor array as recited in claim 1, wherein the switching transistor and the photo-sensitive cell are only partially fabricated prior to forming the dielectric interlayer.

11. A method of fabricating an image sensor array as recited in claim 1,
   wherein the step (f) of etching first and second vias is performed in accordance with dry etching techniques; and
   wherein the step (h) of etching away portions of the second conductive layer and the first conductive layer is performed in accordance with wet etching techniques.

12. A method of fabricating an image sensor array as recited in claim 1,
   wherein the step (f) of etching first and second vias is performed in accordance with wet etching techniques; and
   wherein the step (h) of etching away portions of the second conductive layer and the first conductive layer is performed in accordance with dry etching techniques.

13. A method of fabricating an image sensor array as recited in claim 1, wherein the step (h) of etching away portions of the second conductive layer and the first conductive layer does not substantially remove the dielectric interlayer.

14. A method of fabricating an image sensor array as recited in claim 1, wherein the switching transistor is a thin-film-transistor.

15. A method of fabricating an image sensor array that reduces the potential for defects resulting from electrostatic discharge events during fabrication, the method comprising:
 (a) providing an insulating substrate;
 (b) forming at least one pixel over the substrate, the pixel including a switching device and a photo-sensitive cell, the switching device having a data electrode, the photo-sensitive cell having a bias electrode;
 (c) forming a dielectric interlayer over the switching device and the photo-sensitive cell;
 (d) depositing a first conductive layer over the dielectric interlayer;
 (e) patterning and etching the first conductive layer and the dielectric interlayer to create first and second vias in and through the first conductive layer and the dielectric interlayer, the first and second vias having inner walls formed by exposed portions of the first conductive layer and the dielectric interlayer, the first via exposing a portion of the data electrode, the second via exposing a portion of the bias electrode;
 (f) depositing a second conductive layer directly over the first conductive layer, over the inner walls of the first and second vias, and over the exposed portions of the data electrode and the bias electrode; and
 (g) etching away portions of the second conductive layer and the first conductive layer to form data lines that provide electrical contact with the data electrode, and voltage bias lines that provide electrical contact with the bias electrode;
 (h) whereby the pixels of the image sensor array are substantially protected from electrostatic discharge events by the presence of the first conductive layer deposited over the dielectric interlayer.

16. A method of fabricating an image sensor array as recited in claim 15, wherein the first conductive layer is formed of titanium-tungsten.

17. A method of fabricating an image sensor array as recited in claim 15, wherein the first conductive layer is formed using a material that can be etched during the etching of steps (e) and (g).

18. A method of fabricating an image sensor array as recited in claim 15, wherein the step (f) of depositing a second conductive layer further includes:
 depositing a first sub-layer over the first conductive layer, over the inner walls of the first and second vias, and over the exposed portions of the drain electrode and the top electrode; and
 depositing a second sub-layer over the first sub-layer.

19. A method of fabricating an image sensor array as recited in claim 18, wherein:
 the first conductive layer is formed of titanium-tungsten;
 the first sub-layer is formed of titanium-tungsten; and
 the second sub-layer is formed of aluminum.

20. A method of fabricating an image sensor array as recited in claim 15, wherein the step (g) of etching away portions of the second conductive layer and the first conductive layer does not substantially remove the dielectric interlayer.

21. A method of fabricating an image sensor array as recited in claim 5, wherein the switching transistor is a thin-film-transistor.

22. A method of fabricating a device that reduces the potential for defects from electrostatic discharge (ESD) events during fabrication, the method comprising:
 forming a sensor array having at least a pixel over a substrate, the pixel including a switching transistor and a photo-sensitive cell, the switching transistor having a transistor electrode, and the photo-sensitive cell having a cell electrode;
 forming a dielectric interlayer over the pixel in the sensor array;
 forming a first conductive layer over the dielectric interlayer;
 patterning the first conductive layer and the dielectric interlayer to form a via connecting to at least one of the electrodes in the pixel in the sensor array, wherein the first conductive layer deposited over the dielectric interlayer protects from ESD; and
 forming a second conductive layer directly over the first conductive layer, and wherein the photo-sensitive cell is configured to sense radiation.

23. A method as in claim 22 further comprising:
 removing the first conductive layer after forming the via.

24. A method as in claim 22 further comprising:
 removing the conductive layer while leaving a portion of the conductive layer in the vicinity of the via.

25. A method as in claim 22 wherein the substrate comprises an insulating substrate.

26. A method as in claim 22 wherein the switching transistor comprises a gate electrode, a source electrode and a drain electrode.

27. A method as in claim 22 wherein forming the dielectric interlayer, comprises depositing the dielectric interlayer.

28. A method as in claim 22 wherein forming the first conductive layer comprises depositing the first conductive layer.

29. A method as in claim 22 wherein patterning the first conductive layer and the dielectric interlayer to form the via comprises forming a via-patterned photoresist layer over the first conductive layer; and etching the via in and through the first conductive layer and the dielectric interlayer using the via-patterned photoresist layer.

30. A method as in claim 22 further comprising etching away portions of the second conductive layer and the first conductive layer to form data lines that provide electrical contact with the transistor electrode, and voltage bias lines that provide electrical contact with the cell electrode.

* * * * *

UNITED STATES PATENT AND TRADEMARK OFFICE
Certificate

Patent No. 7,902,004 B2                                          Patented: March 8, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Richard Weisfield, Los Altos, CA (US); Kungang Zhou, San Jose, CA (US); David Doan, San Jose, CA (US); and Paul G. Carey, Mountain View, CA (US).

Signed and Sealed this Fourteenth Day of August 2012.

KIMBERLY NGUYEN
*Supervisory Patent Examiner*
Art Unit 2894
Technology Center 2800

UNITED STATES PATENT AND TRADEMARK OFFICE
Certificate

Patent No. 7,902,004 B2            Patented: March 8, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Richard Weisfield, Los Altos, CA (US); Kungang Zhou, San Jose, CA (US); David Doan, San Jose, CA (US); and Paul G. Carey, Mountain View, CA (US).

Signed and Sealed this Eleventh Day of September 2012.

KIMBERLY RIZKALLAH
*Supervisory Patent Examiner*
Art Unit 2894
Technology Center 2800